(12) United States Patent
Cheng et al.

(10) Patent No.: US 8,604,519 B2
(45) Date of Patent: Dec. 10, 2013

(54) SELF-ALIGNED III-V FIELD EFFECT TRANSISTOR (FET) AND INTEGRATED CIRCUIT (IC) CHIP

(75) Inventors: Cheng-Wei Cheng, White Plains, NY (US); Shu-Jen Han, Cortlandt Manor, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/487,473

(22) Filed: Jun. 4, 2012

(65) Prior Publication Data

US 2012/0248535 A1    Oct. 4, 2012

Related U.S. Application Data

(62) Division of application No. 13/074,854, filed on Mar. 29, 2011.

(51) Int. Cl.
*H01L 29/66* (2006.01)
*H01L 21/02* (2006.01)
*H01L 31/06* (2012.01)

(52) U.S. Cl.
USPC ............ 257/192; 257/194; 257/200; 257/201

(58) Field of Classification Search
USPC .................................. 257/192, 194, 200, 201
See application file for complete search history.

(56) References Cited

U.S. PATENT DOCUMENTS

| | | | | |
|---|---|---|---|---|
| 4,745,449 A | * | 5/1988 | Chang et al. | 257/289 |
| 5,497,024 A | * | 3/1996 | Shibuya et al. | 257/410 |
| 5,747,838 A | * | 5/1998 | Mishra et al. | 257/192 |
| 5,767,549 A | * | 6/1998 | Chen et al. | 257/347 |
| 5,798,555 A | * | 8/1998 | Mishra et al. | 257/410 |
| 6,013,569 A | * | 1/2000 | Lur et al. | 438/595 |
| 6,617,212 B2 | * | 9/2003 | Cho et al. | 438/270 |
| 7,700,425 B2 | * | 4/2010 | Wagner et al. | 438/199 |
| 2008/0128751 A1 | * | 6/2008 | Langdo et al. | 257/191 |
| 2009/0273010 A1 | * | 11/2009 | Simoen et al. | 257/288 |
| 2010/0213512 A1 | * | 8/2010 | Ko | 257/194 |

OTHER PUBLICATIONS

H. Q. Jia, "The study of thermal stability during wet oxidation of AlAs", Journal of crystal growth, 233, pp. 484-488 (2001).*

* cited by examiner

*Primary Examiner* — Long K Tran
*Assistant Examiner* — Dzung Tran
(74) *Attorney, Agent, or Firm* — Law Offices of Charles W. Peterson, Jr.; Louis J. Percello, Esq.

(57) ABSTRACT

Field Effect Transistors (FETs), Integrated Circuit (IC) chips including the FETs, and a method of forming the FETs and IC. FET locations are defined on a layered semiconductor wafer. The layered semiconductor wafer preferably includes a III-V semiconductor surface layer, e.g., Gallium Arsenide (GaAs), and a buried layer, e.g., Aluminum Arsenide (AlAs). Portions of the buried layer are converted to dielectric material, e.g., Aluminum Oxide (AlO), at least beneath FET source/drain regions. The converted dielectric material may extend completely under the FET. Source/drain contacts are formed to FETs above the dielectric material in the buried layer.

14 Claims, 8 Drawing Sheets

SELF-ALIGNED III-V FIELD EFFECT TRANSISTOR (FET) AND INTEGRATED CIRCUIT (IC) CHIP

CROSS REFERENCE TO RELATED APPLICATION

The present invention is a divisional of U.S. application Ser. No. 13/074,854 "SELF-ALIGNED III-V FIELD EFFECT TRANSISTOR (FET), INTEGRATED CIRCUIT (IC) CHIP AND METHOD OF MANUFACTURE" to Cheng-Wei Cheng et al., issued Jun. 18, 2013, as U.S. Pat. No. 8,466,493; and, related to U.S. application Ser. No. 13/074,878 "III-V FIELD EFFECT TRANSISTOR (FET) AND III-V SEMICONDUCTOR ON INSULATOR (IIIVOI) FET, INTEGRATED CIRCUIT (IC) CHIP AND METHOD OF MANUFACTURE" to Cheng-Wei Cheng et al., filed coincident herewith assigned to the assignee of the present invention and incorporated herein by reference.

BACKGROUND OF THE INVENTION

1. Field of the Invention

The present invention generally relates to III-V semiconductor Field Effect Transistor (FET) manufacture and more particularly to improving yield and reliability in III-V semiconductor chip manufacture.

2. Background Description

An ideal Field Effect Transistor (FET) can be modeled simply as a current source ($I_{sat}$) and a switch. A FET inverter may be modeled simply as a pair of the switches and current sources driving a load modeled as a capacitor ($C_{load}$). This model is valid as long as path resistance and/or device resistance is negligible. Under those conditions, and ignoring any propagation delays, circuit performance is determined by drive current ($I_{sat}$) and load ($C_{load}$), i.e., $I_{sat}=C_{load}dV/dt$. Wiring path resistance and internal device resistances, however, complicate the model and erode performance.

Path and device resistance introduce series resistance into the path. Normal device resistance is either channel resistance or source/drain resistance. Source/drain resistance may be attributed to diffusion resistance, which is the resistance in the source/drain diffusion between the channel and the capacitive load; and contact resistance, i.e., at the typically metal to diffusion connection between the source/drain diffusion and the capacitive load. While the source/drain diffusion may be shortened to reduce diffusion resistance, for example, by locating the load adjacent to the channel (e.g., forming contacts at the gate edges), contact resistance, arguably considered as path resistance, is still present. Because a bare metal to semiconductor contact forms a Schottkey diode, semiconductor manufacturing typically includes steps to form a resistive contact and, simultaneously, minimize contact resistance.

III-V semiconductor (e.g., GaAs, InP, InGaAs and etc.) manufacturing, for example, typically involves alloying metal with the doped semiconductor to form low-resistance contact. Unfortunately, however, absent using difficult process controls that require delicate and precise alloying steps, the contact alloy may penetrate too deeply beyond the diffusion and into underlying the substrate during contact formation, which can cause device shorts, e.g., source/drain to substrate shorts and/or source to drain shorts. These defects in a single transistor can ruin an entire IC chip.

FIG. 1 shows an example of a prior art III-V semiconductor device 50. The device is formed on a semiconductor wafer 52, a Gallium Arsenide (GaAs) wafer in this example. The GaAs wafer 52 includes a body doped substrate 54 (e.g., doped with an N-type dopant) supporting a heavily doped layer 56 (doped in this example with a P-type dopant) and a channel doped surface layer 58 (in this example body with a P-type dopant). Gate oxide 60 and gates 62 on surface layer 58 define the FETs with contacts 64 formed alloying metal with the semiconductor at device (N-type) source/drains at either end of the channels, i.e., either side of gates 62.

As is apparent in this example, the metal contacts 64 formed through the surface layer 58 into the heavily doped layer 56, essentially shorting the contacts to substrate and together. These shorts from deep alloy penetration in the contact area, cause heavy leakage in and to the doped substrate region. This heavy leakage is a very significant current loss for short channel devices and, if large enough may make defective (dis or non-functional) any the circuit that includes one or more of the devices.

The state of the art approach requires precisely controlling process time and temperature to control the alloy depth. Unfortunately, while the controlling ambient temperature within a chamber and for a specified period of time may be relatively easy, localized variations within the chamber at contact level, for example, may make it difficult to control the depth and contact profile with uniformity. Consequently, contact profile may vary from contact to contact, wafer site to site, and wafer to wafer. Further, post contact-formation, channel and re-growth materials used may degrade well-formed contacts to increase contact resistance and/or form mis-contacts.

Thus, there exists a need for improved contact formation in III-V semiconductor manufacturing, and more particularly for simplifying low resistance III-V semiconductor contact formation while avoiding contact to substrate and/or channel shorts to improve chip yield and reliability.

SUMMARY OF THE INVENTION

It is a purpose of the invention to improve contact formation in III-V semiconductor manufacturing;

It is another purpose of the invention to simplify low resistance III-V semiconductor contact formation;

It is yet another purpose of the invention to avoid contact to substrate and/or channel shorts while forming low resistance III-V semiconductor contact.

The present invention relates to a Field Effect Transistors (FETs), Integrated Circuit (IC) chips including the FETs, and a method of forming the FETs and IC. FET locations are defined on a layered semiconductor wafer. The layered semiconductor wafer preferably includes a III-V semiconductor surface layer, e.g., Gallium Arsenide (GaAs), and a buried layer, e.g., Aluminum Arsenide (AlAs). Portions of the buried layer are converted to dielectric material, e.g., Aluminum Oxide (AlO), at least beneath FET source/drain regions. The converted dielectric material may extend completely under the FET. Source/drain contacts are formed to FETs above the dielectric material in the buried layer.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 2:
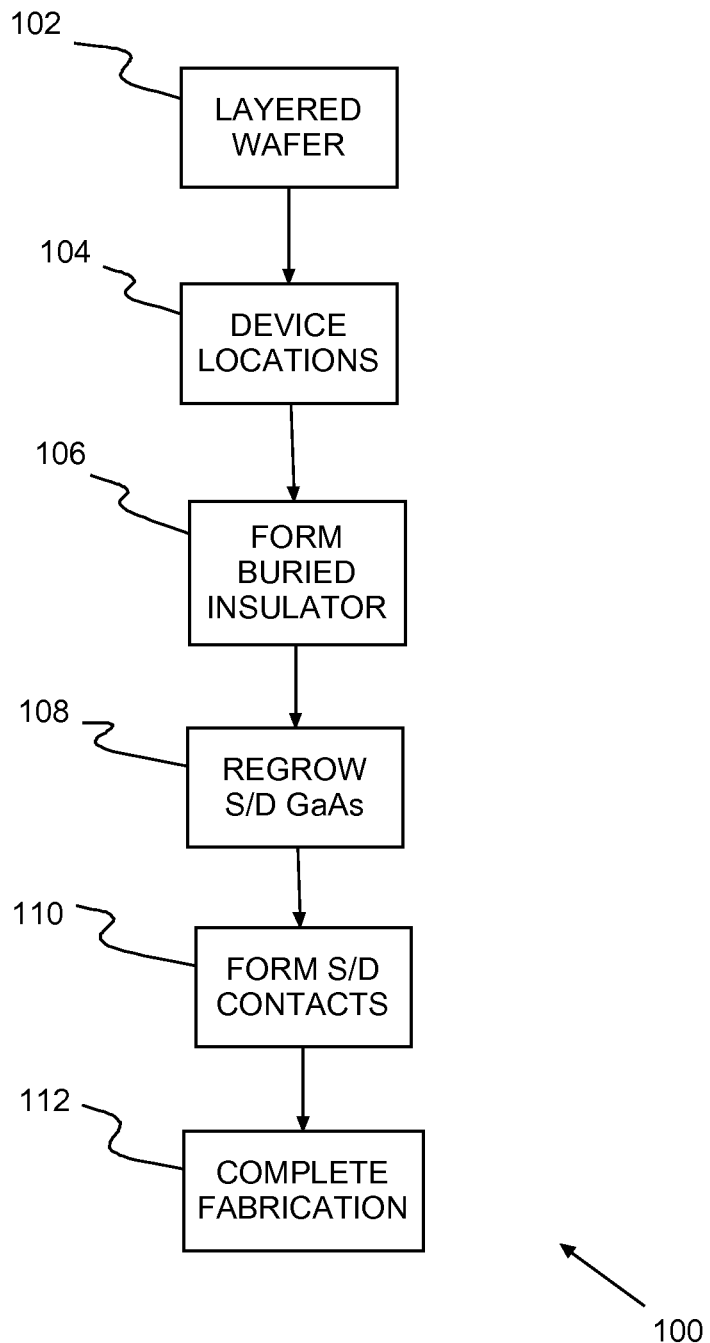
FIG. 2 shows an example of steps in a method for forming device contacts to III-V semiconductor devices according to a preferred embodiment of the present invention.

Turning now to the drawings and, more particularly, FIG. 2 shows an example of steps in a method 100 for forming device contacts to III-V semiconductor Field Effect Transistors (FETs) or devices according to a preferred embodiment of the present invention. In particular, preferred FETs include a dielectric formed below source/drain regions prior to forming source/drain contacts. Contacts thus formed above the dielectric provide resistive source/drain region contacts that remain isolated from the channel and substrate; thereby preventing shorts that might otherwise occur and improving manufacturing yield and chip reliability.

Fabrication begins 102 with a layered wafer and defining 104 device locations on the wafer. Locations may be defined by forming FET gates on the wafer and opening the surface layer at, and self-aligned to, the gates. The open surface layer exposes a buried layer buried beneath the surface layer. Exposed buried layer is replaced 106 with a dielectric at least under the area where source/drain contacts will be formed. Semiconductor is regrown 108 over exposed buried dielectric layer areas and contacts are formed 110 to regrown semiconductor in source/drain regions. Finally, normal IC chip fabrication resumes 112, connecting devices together to form circuits and wiring circuits together to form chips.

Figure 1:
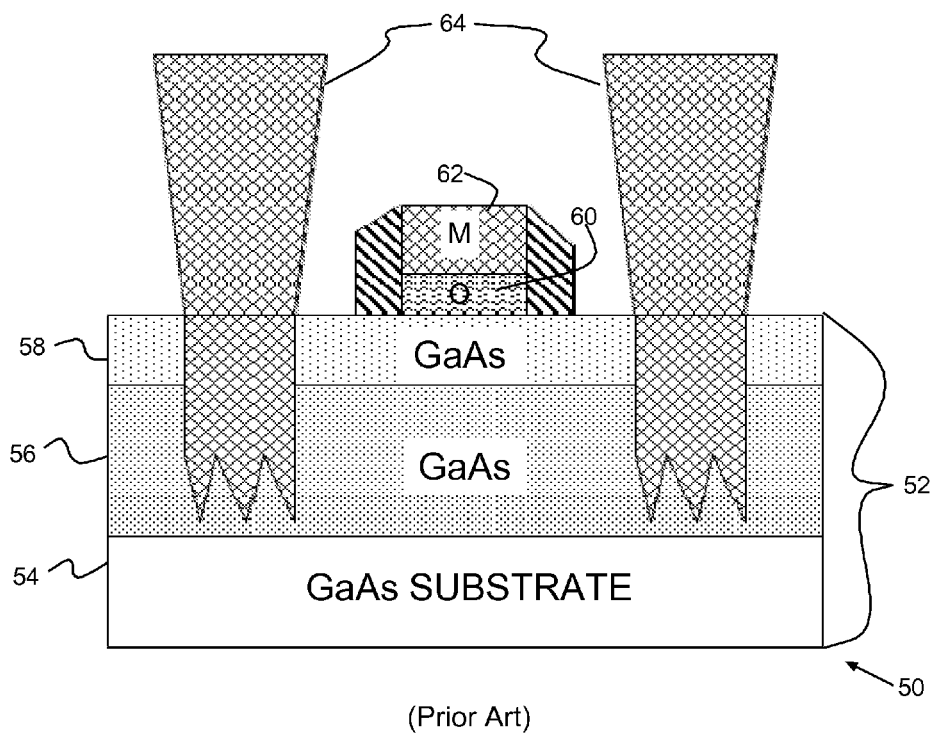
FIG. 1 shows an example of a prior art III-V semiconductor device.
Figure 3:
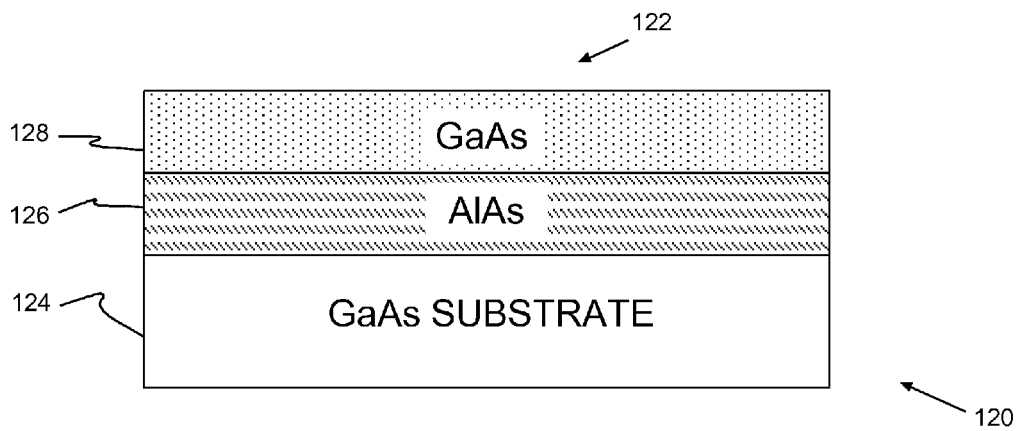
FIG. 3 shows an example of a cross section layered wafer at a device location provided for fabrication.

FIG. 3 shows a cross sectional example of a layered wafer 120 at a device location 122 provided 102 for preferred Integrated Circuit (IC) fabrication with reference to FIG. 2. In this example, the wafer 120 includes a Gallium Arsenide (GaAs) substrate 124, an Aluminum Arsenide (AlAs) buried layer 126 on the GaAs substrate 124, and a GaAs surface layer 128 on the AlAs buried layer 126. Preferably, the AlAs buried layer 126 is less than 2000 nanometers (nm) thick and most preferably 50 nm thick. Preferably also, the GaAs surface layer 128 is less than 100 nm thick and most preferably 10 nm thick.

FIGS. 4A-D show an example of defining device locations 122 (104 in FIG. 2) on the wafer 120 and opening orifices through the surface layer 128. First in FIG. 4A, gate formation begins with forming a gate dielectric layer 130, less than 10 nm thick and preferably 5 nm thick, formed on the surface layer 128. A gate layer 132, less than 100 nm thick, and preferably 50 nm thick metal, is formed on the gate dielectric layer 130. Gates 134 are patterned, e.g., using typical state of the art photolithographic patterning techniques. The gate dielectric 130, e.g., $HfO_2$, $Al_2O_3$ or $SiO_2$, may be patterned with, before or after patterning the gates 132. After the gates 134 are patterned, source/drain regions 136 are defined on both sides of the gates 134. Sidewall spacers 138, less than 100 nm wide and preferably 15 nm wide, are formed along both sides of the gates 134. Sidewall spacers 138 may be formed, for example, by forming a conformal layer of dielectric material, e.g., nitride or oxide, and removing horizontal portions of the conformal dielectric layer using, for example, a reactive ion etch (RIE).

Figure 4A:
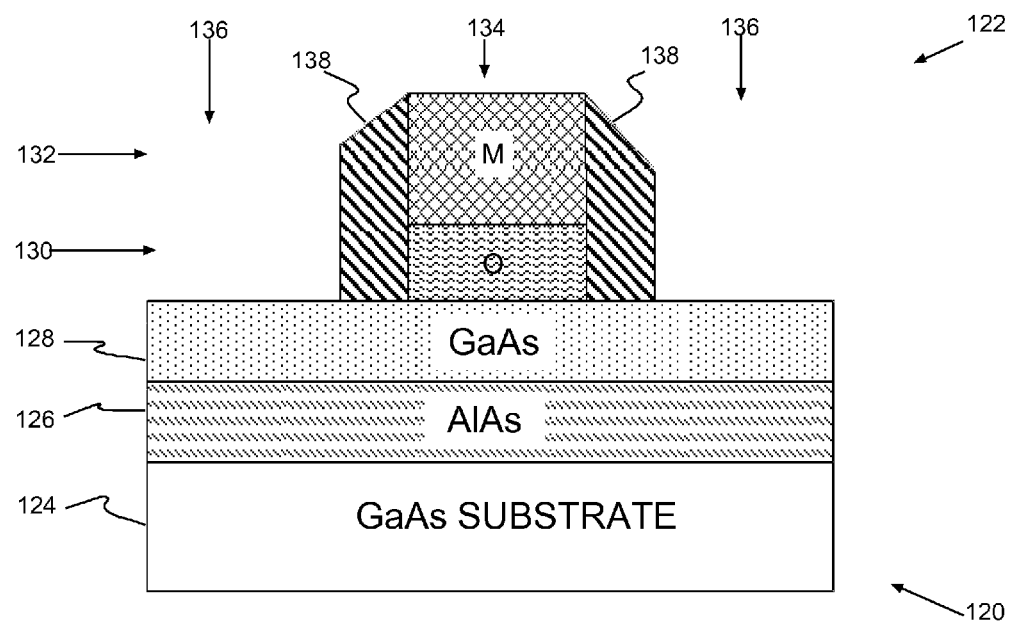
FIGS. 4A-D show an example of defining device locations on the wafer and opening the surface layer.
Figure 4B:
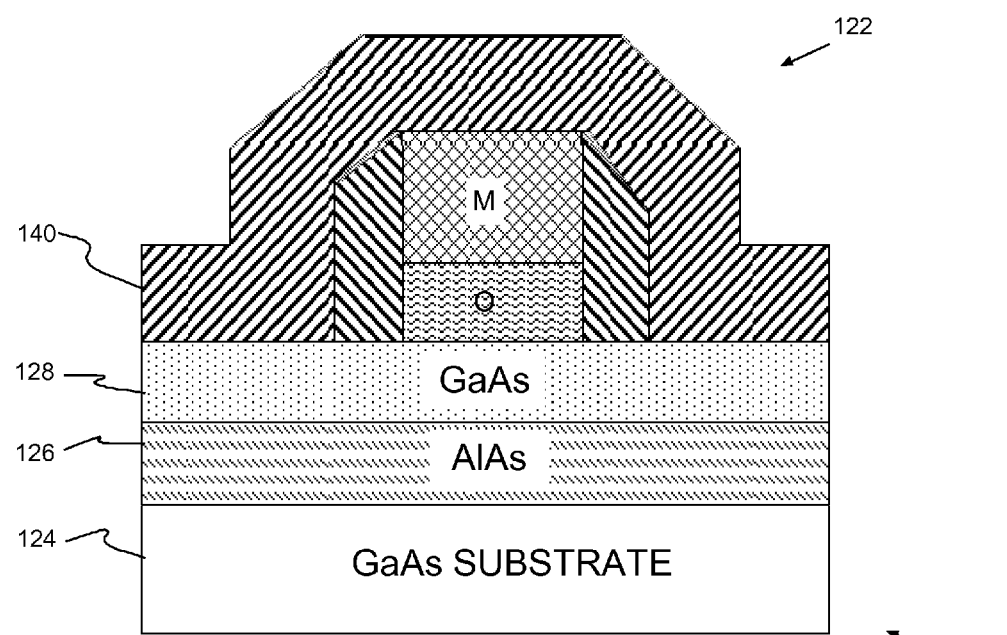
Figure 4C:
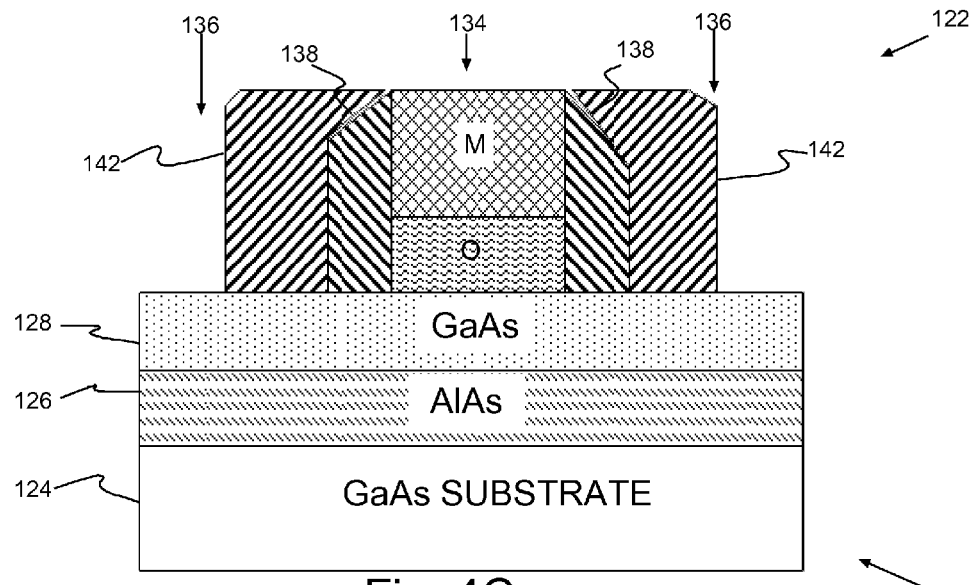

Next in FIG. 4B sacrificial spacers are formed by forming a second conformal dielectric layer 140 on the wafer 120. Preferably, the second conformal dielectric layer 140 is nitride less than 100 nm thick and most preferably 15 nm thick. Horizontal portions of the second conformal dielectric layer 140 are removed using, for example, a reactive ion etch (RIE). Thus, second (sacrificial) spacers 142 in FIG. 4C are formed outboard of sidewall spacers 138. The sacrificial spacers 142 partially cover and protect a portion of source/drain regions 136.

Figure 4D:
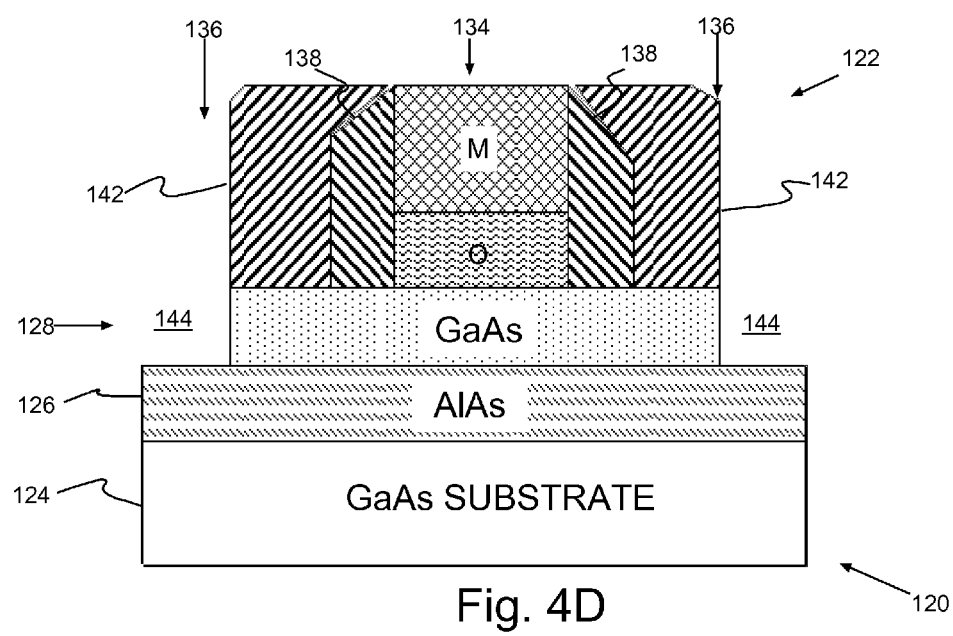

In FIG. 4D the exposed areas of surface layer 128 are removed. Exposed surface layer 128 may be wet or dry etched using either an etch controlled for depth or, preferably, using an etchant selective to the GaAs. Removing exposed surface layer 128 opens orifices 144 to the AlAs buried layer 126 in source/drain regions 136.

Figure 5A:
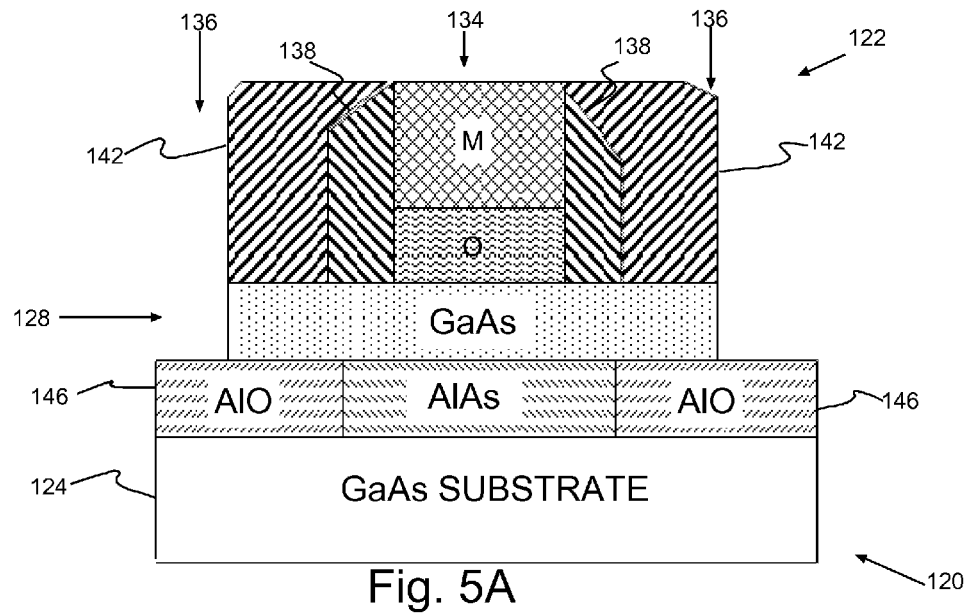
FIGS. 5A and B show the AlAs buried layer after partially or fully oxidize oxidized to replace exposed buried layer with a dielectric at least under the source/drain area where contacts will be formed.
Figure 5B:
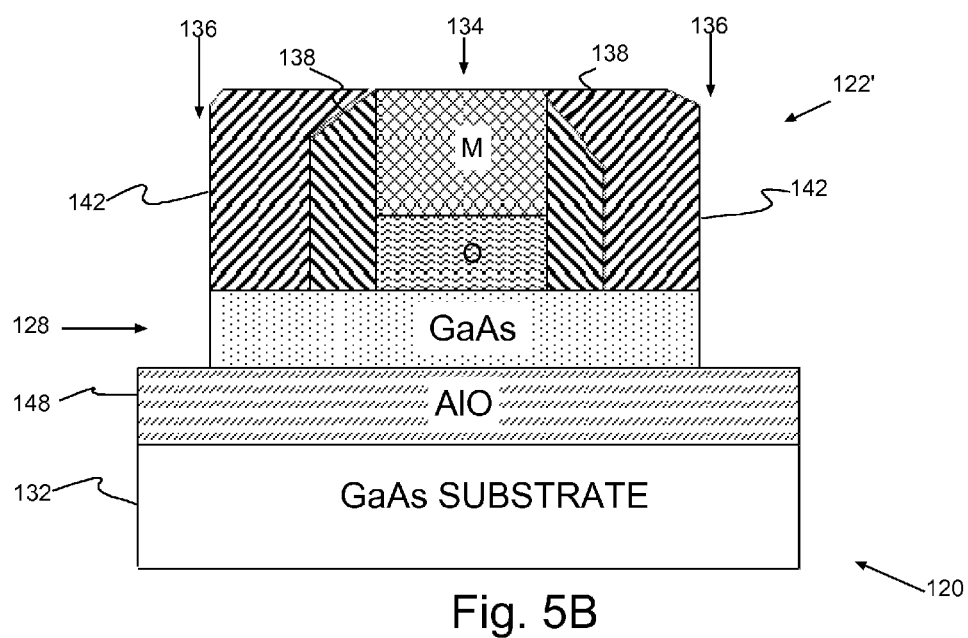

Next, as shown in FIGS. 5A and B, the AlAs buried layer 126 is partially or fully oxidized, to replace (106 in FIG. 2) exposed buried layer 126 with a dielectric or insulator at least under the source/drain area where contacts will be formed. Preferably, the wafer 120 is immersed in an oxidization medium, e.g., oxygen or steam, for a timed oxidization. Since AlAs has a much higher oxidization rate than other exposed materials, e.g., the metal gates 134 or semiconductor 128 surfaces, the buried layer 126 may be completely oxidized without significant oxidization to those exposed materials. Thus the extent of oxidization can be controlled by time and temperature to partially convert, e.g., oxidizing the AlAs under the source/drain regions to AlO 146 in FET 122; or long enough to fully convert the AlAs, oxidizing the AlAs layer under the entire device 122 to AlO 148 in device 122'.

Figure 6A:
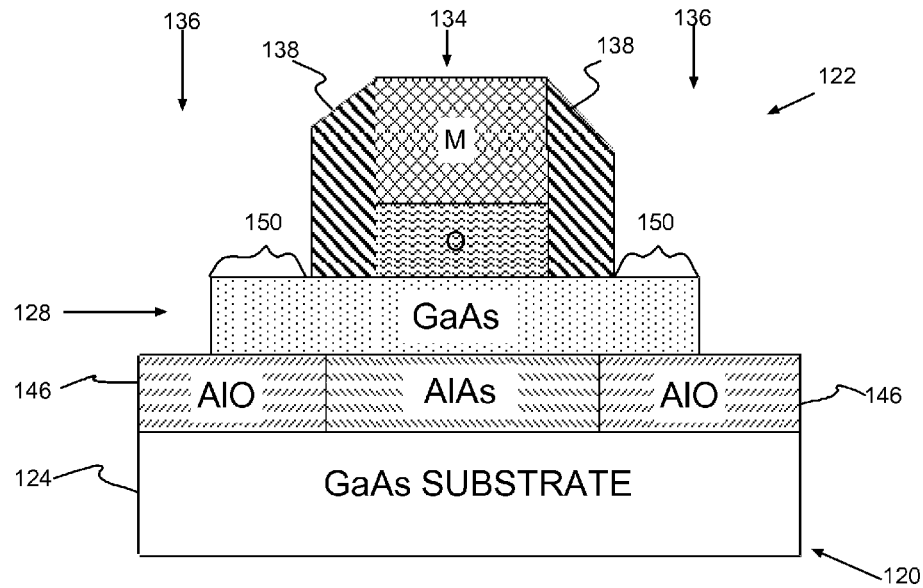
FIGS. 6A and B show surface layer regrowth over exposed areas of converted dielectric.
Figure 6B:
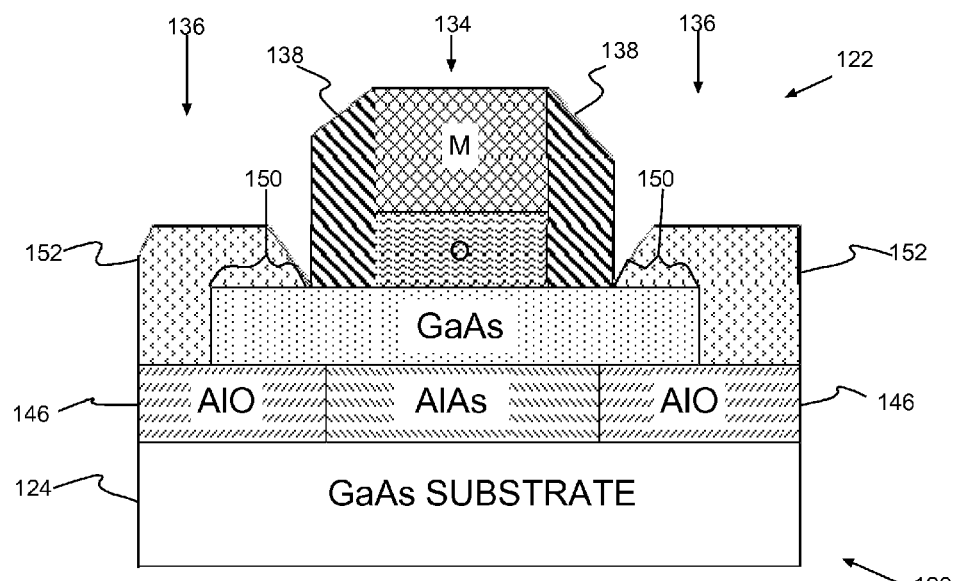

FIGS. 6A and B show surface layer regrowth (108 in FIG. 2) over exposed source/drain 136 areas of converted dielectric 146 for FET 122. First, using a suitable state of the art solvent/etchant, the sacrificial spacers (142 in FIGS. 4C, D, 5A and B) are removed, re-exposing remaining portions 150 of the source/drain regions 136. Next, semiconductor material 152 is selectively grown in orifices 144, covering the converted dielectric 146 and overlapping the remaining source/drain portions 150. Preferably, the refill material 152 is heavily doped (more heavily than normal source/drain doping) GaAs, Indium Arsenide (InAs) or another suitable semiconductor material, grown on exposed areas (upper surfaces and exposed sidewalls) of remaining portions 150 sufficient to fill orifices 144.

Since this is regrown post oxidization in 106, the extent of conversion (partially or fully under the preferred FET) has no bearing on surface layer regrowth 108, regrowth proceeds substantially identically for the fully converted buried layer 148 in example 122' as for the partially converted buried layer 146 example 122. Having completed device definition with source/drain regions 136 residing completely on dielectric 146, 148, an interlevel dielectric layer (not shown) may be formed on the wafer and chip fabrication can continue normally, e.g., forming multiple wiring layers through normal Back End of the Line (BEOL) semiconductor manufacturing.

Figure 7A:
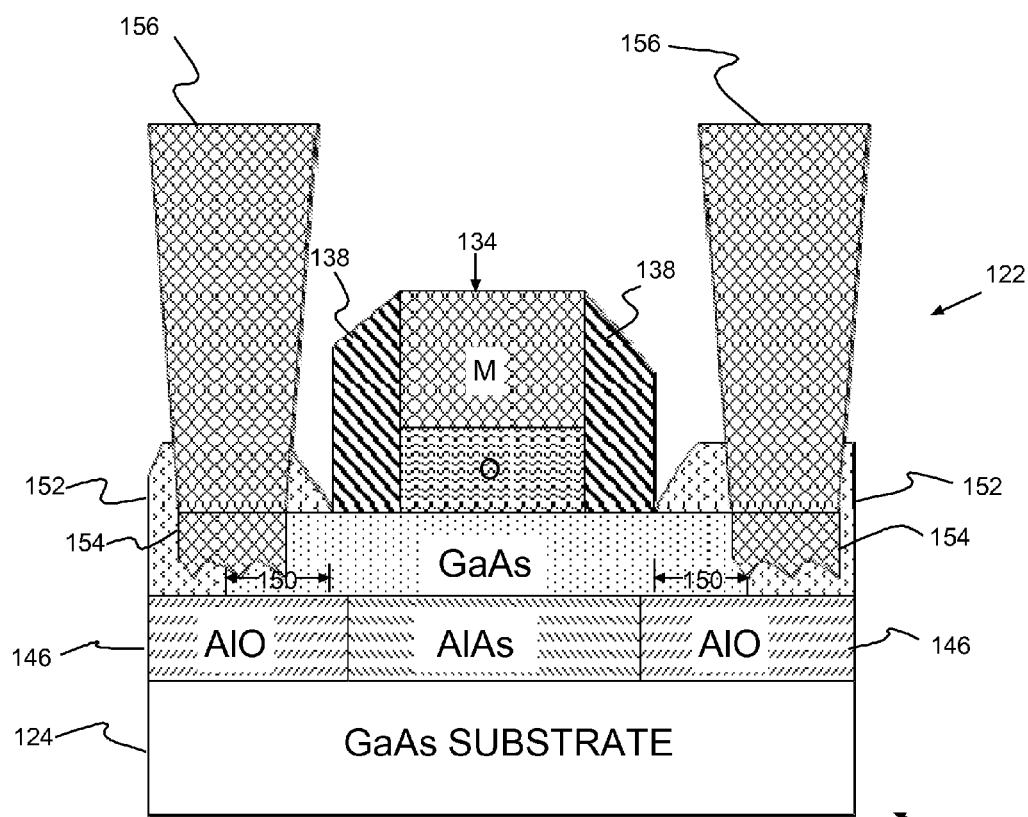
FIGS. 7A-B show contacts and/or through-vias opened through dielectric to and into source/drain regions of FETs for metal contacts.
Figure 7B:
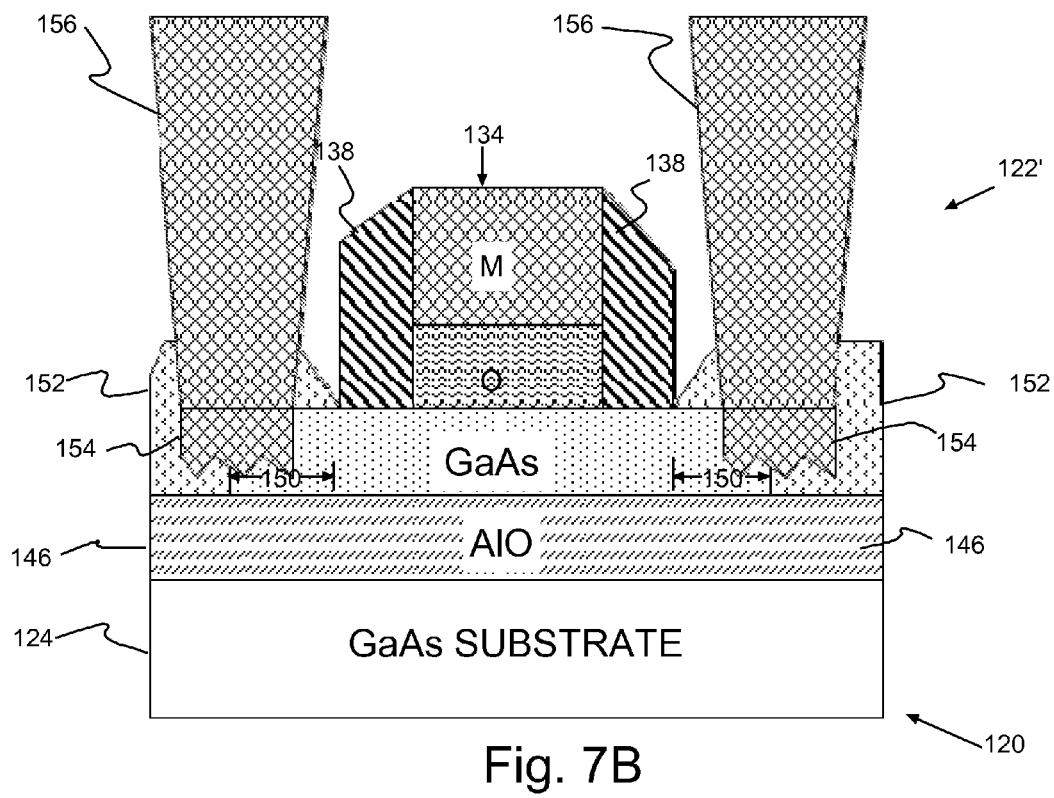

So in 110 of FIG. 2 as shown in FIGS. 7A-B, contacts 154 and/or through-vias are opened through the interlevel dielectric (not shown) at least to and into source/drain regions of FETs 122 and 122'. Metal, which may be in the lowest chip wiring layer, is alloyed with the source/drain regions to form heavily doped III-V semiconductor source/drain contacts 154, 156. Preferably, the alloyed metal is Gold (Au), Germanium (Ge), Nickel (Ni), an alloy thereof or any other metal suitable for forming ohmic contact to the III-V layers. The source/drain contacts 154 provide an ohmic contact that, in these examples, penetrates both regrown material 152 and source/drain portions 150, but not the underlying converted dielectric 146, 148. After alloying to form contacts chip fabrication continues in 112.

Figure 8:
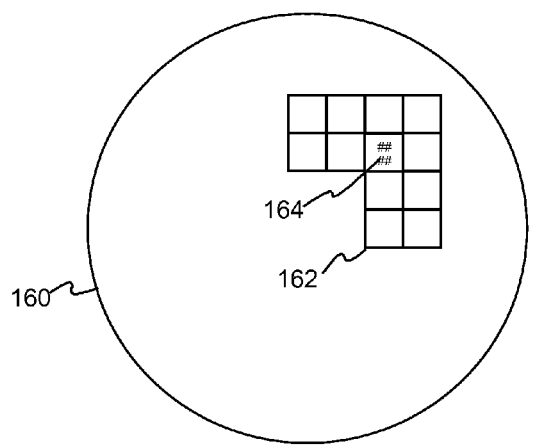
FIG. 8 shows an example of a wafer with chips manufactured according to a preferred embodiment of the present invention.

FIG. 8 shows an example of a wafer 160 with chips 162 manufactured according to a preferred embodiment of the present invention. Metal layers (not shown) are formed after alloying contacts 154, connecting to metal wires 156 using a suitable metal formation process, e.g., in a dual damascene metal line formation step, to contact the FETs 122 and 122' for chip wiring. Metal lines on upper layers (not shown) wire chip FETs into chip circuits 164 and chip circuits 164 together. One or more of the connected circuits 164 includes at least one preferred FET.

Thus advantageously, having oxidized the AlAs in the buried layer 126 through openings at each device during device definition (i.e., just after gate definition), layer openings are self-aligned to the gate, to minimize lithography mis-alignment risks. The buried AlAs layer is oxidized locally at each FET 122, 122', but at least beneath the device source/drain regions. The openings are easily filled with semiconductor material, subsequent to oxidization. Thus, the present invention has application to fabricating III-V on insulator (IIIVOI) devices 122' without requiring starting with a semi-Insulating substrate, thereby providing flexibility for III-V device fabrication.

Moreover, leakage current is minimized for preferred devices. Opening ohmic metal to semiconductor contacts above and to, but not penetrating through, the buried oxide, eliminates any potential shorts, i.e., to the substrate or source-to-drain. Further, the gate dielectric sidewalls prevent lateral spiking from the contacts to the gate that may otherwise occur. Thus, the gate dielectric sidewalls prevent shorting source/drain contacts to the gate, i.e., eliminating potential gate to source/drain shorts. Accordingly, preferred devices, circuits and ICs otherwise have much improved manufacturing yield and chip reliability.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A Field Effect Transistor (FET) comprising:
a III-V semiconductor surface layer on a buried semiconductor layer of a layered wafer;
a gate on said III-V semiconductor surface layer;
a dielectric sidewall on along each end of said gate;
a dielectric material region in said buried semiconductor layer, said dielectric material region being beneath both FET source/drain regions only; and
contacts to said source/drain regions.

2. A FET as in claim 1, wherein the III-V semiconductor surface layer is Gallium Arsenide (GaAs), the buried semiconductor layer is Aluminum Arsenide (AlAs) and the dielectric material is Aluminum Oxide (AlO).

3. A FET as in claim 2, wherein AlO is under the GaAs layer for the entire FET, the FETs being III-V on insulator (IIIVOI) devices.

4. A FET as in claim 1, wherein contacts to said source/drain regions terminate at or above said dielectric material region.

5. A FET as in claim 4, wherein contacts to said source/drain regions are metal alloyed with surface layer semiconductor material in source/drain regions.

6. An Integrated Circuit (IC) chip comprising: a semiconductor substrate;
a buried semiconductor layer on said semiconductor substrate;
a III-V semiconductor surface layer;
a plurality of Field Effect Transistors (FETs) on said III-V semiconductor surface layer connected into a plurality of IC chip circuits, one or more of said FETs comprising:
a device channel in said III-V semiconductor surface layer,
a gate on said device channel,
a dielectric sidewall on along each end of said gate,
a dielectric material region in said buried layer, said dielectric material region being beneath both FET source/drain regions only,
contacts to said source/drain regions; and
one or more wiring layers, at least one wiring layer connecting to FET source/drain contacts,
wiring in said wiring layers further connecting said FETs into said plurality of IC chip circuits.

7. An IC as in claim 6, wherein said, wherein the III-V semiconductor is Gallium Arsenide (GaAs), the buried semiconductor layer is an Aluminum Arsenide (AlAs) layer and the dielectric material is Aluminum Oxide (AlO).

8. A IC as in claim 7, wherein AlO is under the GaAs layer for the entire FET, the FETs being III-V on insulator (IIIVOI) devices.

9. An IC as in claim 7, wherein said contacts to said source/drain regions are metal alloyed with surface layer semiconductor material in source/drain regions.

10. An IC as in claim 9, wherein said contacts terminate in or above said dielectric material region.

11. A Field Effect Transistor (FET) comprising:
a Gallium Arsenide (GaAs) surface layer on a buried Aluminum Arsenide (AlAs) layer of a layered wafer;
a gate on said GaAs surface layer;
a dielectric sidewall on along each end of said gate;
Aluminum Oxide (AlO) regions in said buried AlAs layer, said AlO regions being beneath both FET source/drain regions only; and
metal contacts to said source/drain regions.

12. A FET as in claim 11, wherein AlO is under the GaAs layer for the entire FET, the FETs being III-V on insulator (IIIVOI) devices.

13. A FET as in claim 11, wherein contacts to said source/drain regions terminate at or above said AlO.

14. A FET as in claim 11, wherein said metal contacts are alloyed with GaAs in source/drain regions.

* * * * *